United States Patent [19]

Meyen et al.

[11] 4,160,893
[45] Jul. 10, 1979

[54] INDIVIDUAL CHIP JOINING MACHINE

[75] Inventors: Robert H. Meyen, Salt Point; Karl J. Puttlitz; Karl Schink, both of Wappingers Falls; Herbert Wenskus, Hopewell Junction, all of N.Y.

[73] Assignee: International Business Machines Corporation, Armonk, N.Y.

[21] Appl. No.: 865,768

[22] Filed: Dec. 29, 1977

[51] Int. Cl.² .................... B23K 1/00; B23K 1/04
[52] U.S. Cl. ..................... 219/85 BA; 219/158; 219/343; 219/347; 219/349; 219/354; 219/358; 228/46; 228/49; 228/240; 156/272; 156/498
[58] Field of Search .......... 219/85 R, 85 BA, 85 BM, 219/158, 339, 343, 347–349, 354, 449, 450, 510, 358; 228/46, 49, 238, 240, 242; 156/272, 497, 499

[56] References Cited

U.S. PATENT DOCUMENTS

| 1,781,244 | 11/1930 | Oswald | 219/222 |
|---|---|---|---|
| 3,083,291 | 3/1963 | Soffa et al. | 219/85 R X |
| 3,165,818 | 1/1965 | Soffa et al. | 219/85 R X |
| 3,486,223 | 12/1969 | Butera | 219/85 R X |
| 3,520,055 | 7/1970 | Jannett | 219/349 X |
| 3,522,407 | 8/1970 | Costello | 219/85 |
| 3,568,307 | 3/1971 | Zanger et al. | 29/589 |
| 3,621,198 | 11/1971 | Herbrich | 219/349 |
| 3,628,717 | 12/1971 | Lynch et al. | 228/49 R X |
| 3,641,648 | 2/1972 | Kalberman | 228/49 R X |
| 3,710,069 | 1/1973 | Papadopoulos et al. | 219/85 R |
| 3,735,911 | 5/1973 | Ward | 228/19 |
| 3,738,560 | 6/1973 | Kulicke et al. | 228/49 R X |
| 3,742,181 | 6/1973 | Costello | 219/85 BA |
| 3,764,772 | 10/1973 | Matuschek | 219/85 BA |
| 3,765,475 | 10/1973 | Hopper | 219/343 |

OTHER PUBLICATIONS

"Recent Developments in Electronics", *Electronics World*, vol. 77, No. 6, Jun. 1967, p. 30.
"Surface Temperature Measurement Probe", *IBM Technical Disclosure Bulletin*, vol. 13, No. 7, Dec. 1970.

*Primary Examiner*—Gerald P. Tolin
*Assistant Examiner*—Susan M. Hoffmann
*Attorney, Agent, or Firm*—Douglas R. McKechnie

[57] ABSTRACT

An individual chip joining machine is designed primarily to bond a single chip to a multi-chip substrate. The machine includes an X-Y table for moving a substrate to locate a chip site beneath a probe. The probe serves to pick up a chip and either place it on the substrate or remove it therefrom and further serves to heat the chip to join it to the substrate by solder reflow or to melt the solder and allow the chip to be removed. The probe is mounted on a Z direction placement mechanism that also includes means to allow the probe to be backed off a fixed distance from a chip, once the chip has been placed on the substrate preparatory to joining thereto. A second heater heats the substrate to a bias temperature, this heating being controlled through use of a surrogate substrate having a thermocouple attached thereto.

14 Claims, 8 Drawing Figures

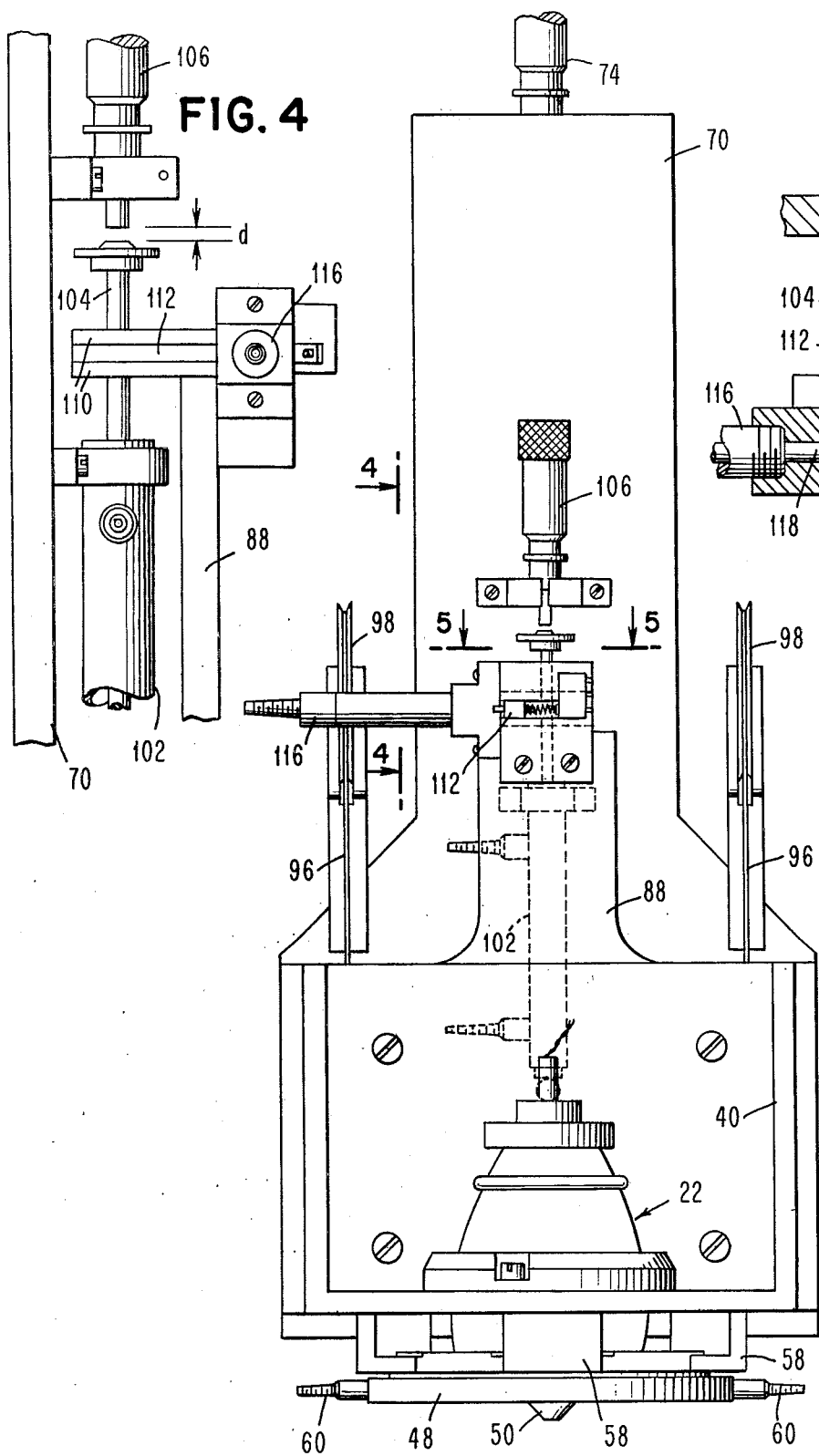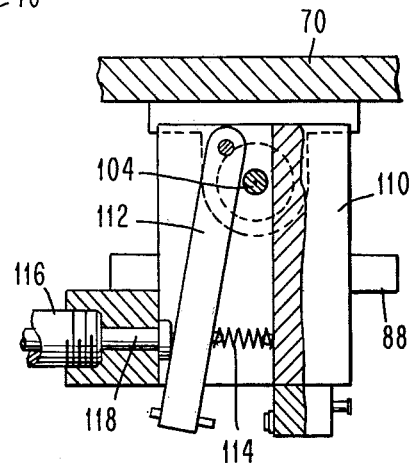

INDIVIDUAL CHIP JOINING MACHINE

SUMMARY OF THE INVENTION

1. Field of the Invention

This invention relates to infrared soldering apparatus for use in bonding individual semiconductor chips to a substrate having a multiplicity of chip sites.

2. Prior Art

The computer industry has developed the use of modules having multiple integrated circuit semiconductor chips solder-bonded on a carrier, e.g., a multi-layer ceramic substrate. Currently, a need has arisen for chip placement, reworking and replacing processes and apparatus which enable a single chip to be placed, reworked or replaced without damaging or degrading adjacent chips or other parts. The need for chip rework may arise due to a faulty connection or lack of a connection as a result of prior joining operations. For example, in accordance with one way of constructing modules, chips having solder balls thereon are placed on prefluxed chip sites. The assemblage is then placed in a solder reflow oven where all chips are simultaneously bonded. Sometimes, incomplete joints may result. One cause might be flux bubbling which causes the chip to tilt whereby only some of the solder joints are complete where the others are incomplete. Such a condition might be fixed by simply refluxing the chip, that is by flowing flux between the chip and substrate and then subjecting the chip to a reflow operation whereby the solder balls are remelted and then solidified. Quite often, the second attempt will cure this type of a defect. There are other defects which can be cured in a similar manner.

Sometimes, the chip itself is faulty or becomes faulty and replacement thereof becomes necessary in order to avoid having to scrap the entire module. Replacement is done by first removing the chip, dressing the chip site to remove any excess solder, fluxing the site, and then attaching a new chip by solder reflow techniques. It may also occur that a chip site is vacant and a new chip is attached at such site, for the first time.

The use of infrared energy for soldering is known. It has the advantages of being easily and readily controlled and can heat an object without touching it. Other methods require touching and hence are not desirable especially in handling chips where contamination causes problems.

OBJECTS OF THE INVENTION

One of the objects of the invention is to provide a chip joining apparatus using an infrared source to develop the energy for solder reflow bonding.

Another object is to provide a chip bonding apparatus in which a single chip on a heavily populated multiple chip carrier of high thermal mass can be reworked or replaced without damaging or degrading neighboring chips or their solder joints, EC (engineering change) wire insulation, the substrate or the chip being joined.

A further object of the invention is to allow a single chip to be reworked or placed by reflow soldering by subjecting the chip to a rapid heating/cooling cycle.

Another object of the invention is to provide a chip placement apparatus in which different chips can be placed on a substrate with a constant force or pressure regardless of irregularities in the height of the surface of the substrate where the chips are to be joined.

Still another object is to provide infrared solder reflow apparatus for joining an individual chip to a multichip carrier wherein the chip is located a fixed predetermined distance from the plane into which energy from an infrared source is focused.

A further object is to provide a novel means for bias heating the substrate on which a chip is to be reworked or placed, so as to minimize any thermal shock of the substrate during the soldering operations.

Still another object is to provide a chip bonding tool which, while primarily designed to bond a chip to the substrate, can also be used to remove a chip from the substrate, or to remelt a solder joint without removing a chip.

Briefly, the invention comprises a probe having a dual function of being a vacuum chip pick-up tool and an infrared heater used to melt solder balls in a reflow soldering operation. During chip placement, the probe carries a chip which is first aligned with a chip site and then moved downwardly to place the chip on the site with a predetermined pressure. Then the probe is moved a fixed distance above the site and a heat source energized to rapidly melt the solder. The heat source is then deenergized allowing cooling to take place. The substrate on which the chip is bonded is bias-heated by means of a second heater that is controlled by means of a thermocouple embedded in a surrogate substrate.

Other objects and advantages of the invention will be apparent from the following description taken in connection with accompanying drawings wherein:

FIG. 1 is a plan view of a portion of a workpiece which the invention is designed to operate upon;

FIGS. 2a and 2b when fitted together from a side elevational view of apparatus embodying the invention;

FIG. 3 is a front elevational view of an enlarged scale of a portion of the embodiment shown in FIGS. 2a and 2b;

FIG. 4 is an enlarged side elevational view, partly in section, looking along reference line 4—4 of FIG. 3;

FIG. 5 is an enlarged detail view looking along reference line 5—5 of FIG. 3;

Figure 1:
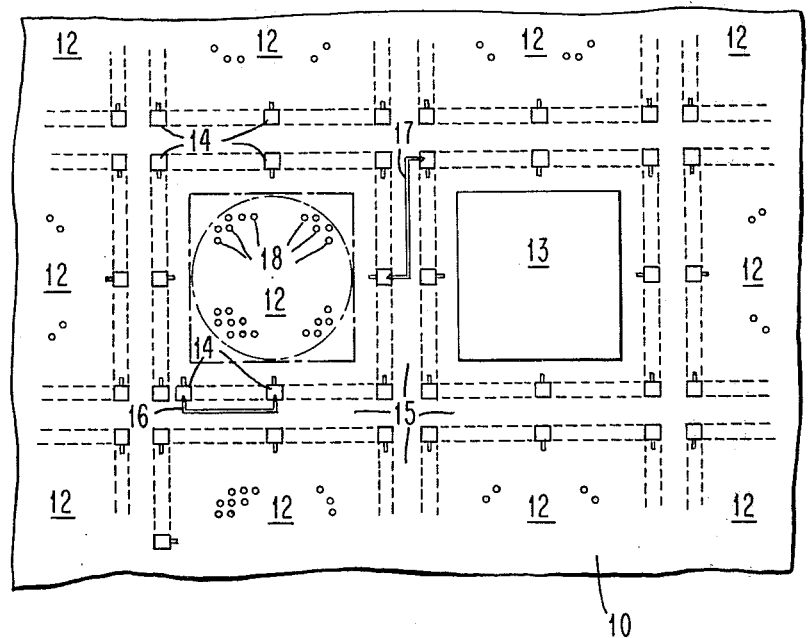
Figure 6:
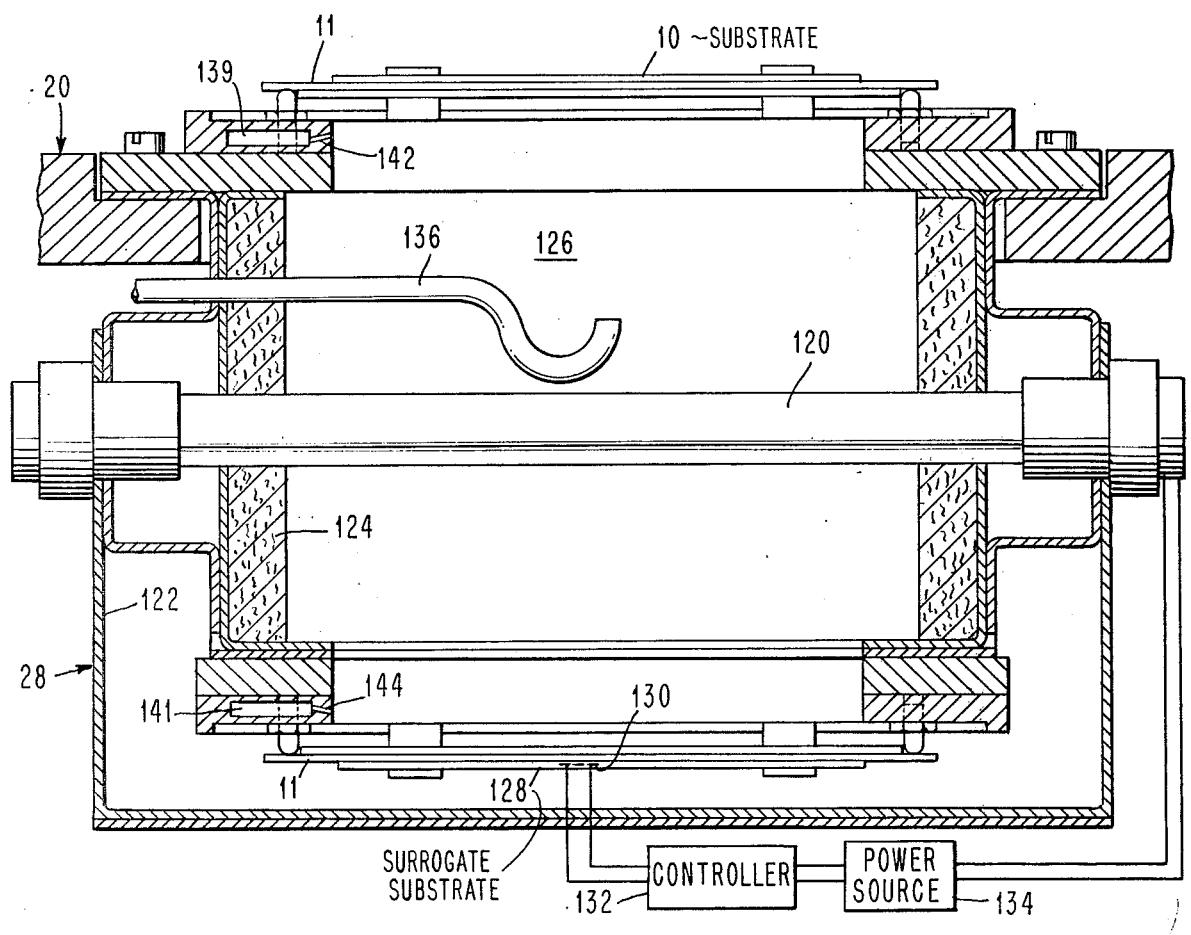
FIG. 6 is an enlarged vertical cross-sectional view along reference line 6—6 of FIG. 2b.

The workpiece which the apparatus of the invention is designed to operate on is best seen in FIGS. 1 and 6. With reference to FIG. 6, the workpiece comprises a multi-layer ceramic substrate 10 that is of a flat rectangular shape and is mounted in a flange 11 which allows the workpiece to be clamped in the apparatus in the manner described hereafter. With reference to FIG. 1, substrate 10 has a multiplicity of chip sites 12 on the upper surface thereof, the chip sites being arranged in an orthagonal pattern. Each chip site 12 is bounded by a plurality of EC pads 14. The areas between the adjacent chip sites are separated to form channels 15 along which EC insulated wires may be routed. By way of example, FIG. 1 shows two such wires 16 and 17. Wire 16 interconnects two EC pads 14 within the same chip site and wire 17 connects two EC pads adjacent chip sites the wires extending along channels 15.

Within the center of each chip site are a plurality of chip pads 18 which have upper surfaces that may be flush with or slightly above or below the surface of substrate 10. Vias (not shown) extend downwardly from these pads to internal layers of metalization within substrate 10 to make the necessary circuit interconnections. Pads 18 are designed to cooperate with pads on the underside of a chip 13 which pads have been coated with solder balls so that the solder joint is formed between chip 13 and pads 18 on a given chip site. In FIG. 1, only one chip 13 is shown. It should be understood however, in a fully or heavily populated board, that at the time of reworking a given chip or chip site, chips will be mounted on adjacent chip sites and that there might be many wires running along channels 15. The purpose of the apparatus described below will be to allow a chip at a given chip site to be reworked or placed without damaging the insulation on any of the EC wires, without melting any of the solder joints of a chip on an adjacent chip site and without damaging or degrading any of the chips themselves or the substrate.

Another problem or factor that has to be taken into account in designing an apparatus for working on such workpieces is that while the substrates have a nominally flat surface upon which the chips are mounted, there might be slight variances in the flatness of the substrate at the chip sites which causes the various chip sites to have slightly different elevations. These variations are due to the unevenness with which the ceramic material sets during the manufacturing process thereof. Another problem is that with different style or type substrates, the size of the substrates including the thickness will vary from substrate to substrate and therefore the apparatus for working on it should be able to take such factor into account.

Figure 2A:
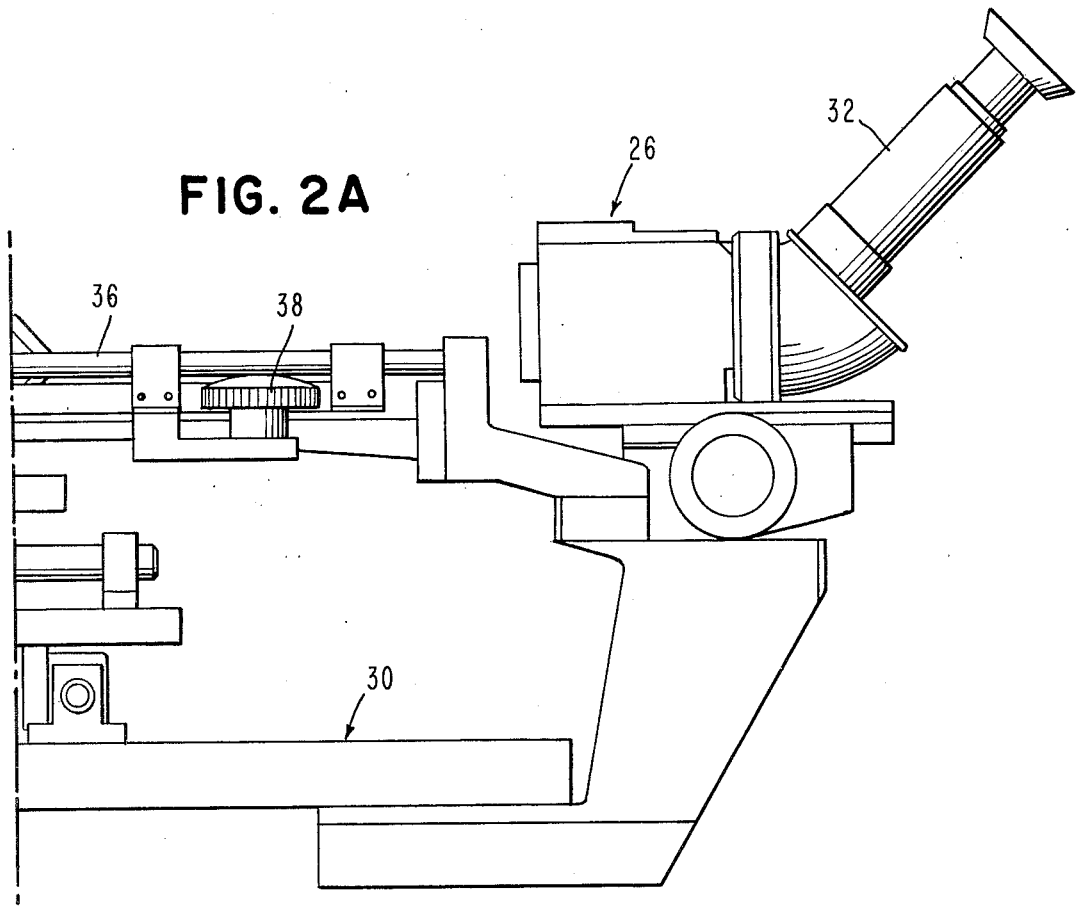
Figure 2B:
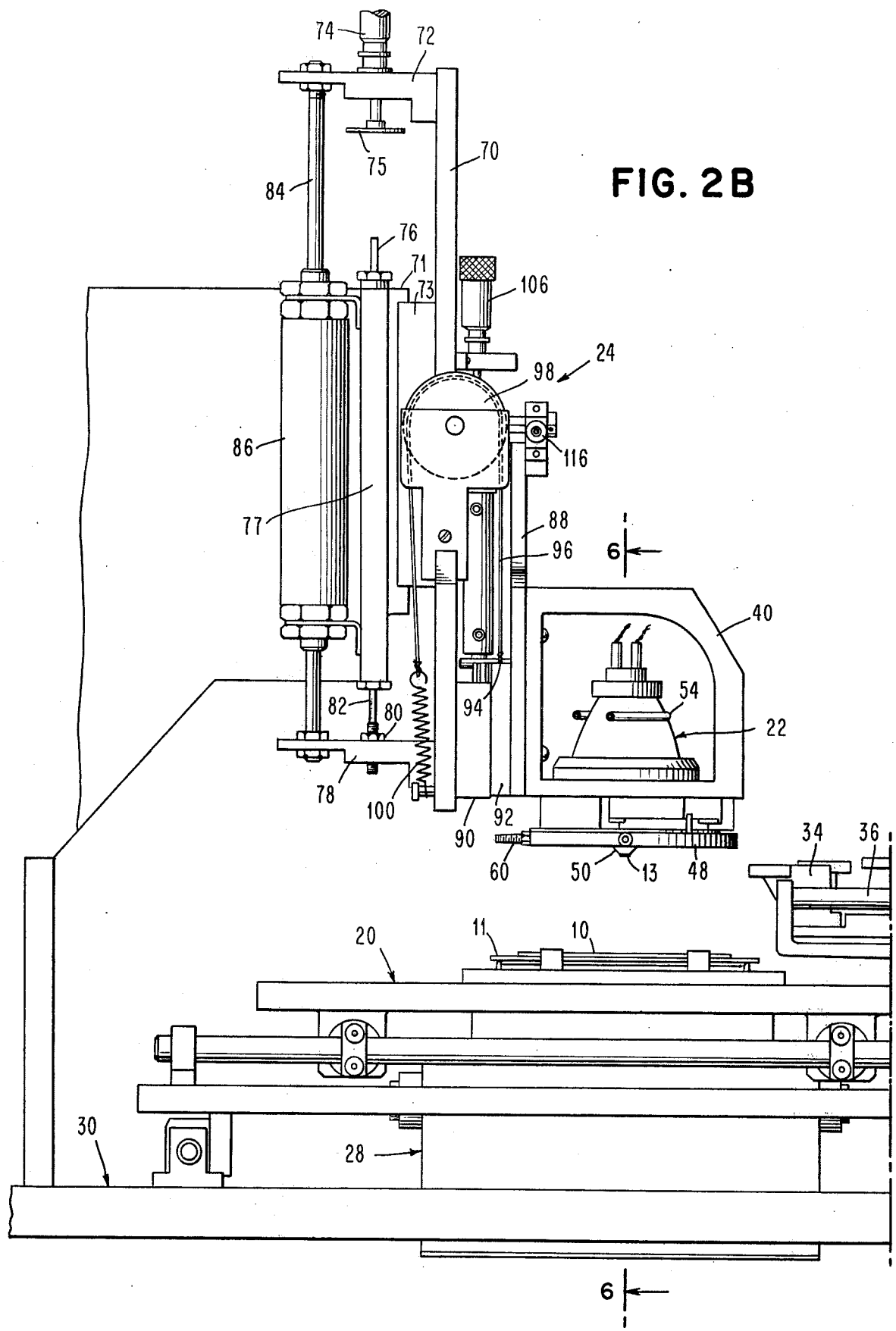

Referring now to FIGS. 2a, 2b and 3, the apparatus of the invention comprises an X-Y table 20 upon which substrate 10 is mounted for movement to locate a predetermined chip site beneath a probe 22. Probe 22 serves a dual function of picking up a chip 13 for placement on or removal from substrate 10, and heating the solder balls or joint associated with a chip for bonding or unbonding. A sliding assembly 24 supports probe 22 for vertical movement. A split image optical system 26 allows simultaneous viewing of chip 13 and a chip site 12 on substrate 10 to allow the alignment thereof. A bias heater 28, heats substrate 10 to an elevated temperature. The above components are all mounted upon a suitably shaped base 30. X-Y table 20 is of conventional construction and includes motive means (not shown) that is selectively actuable by an operator to cause table 20 to be selectively driven a desired amount in either or both of the X or Y directions.

Optical system 26 includes a conventional microscope 32 that views through a split or double prism 34. This prism is in turn mounted to slide along rods 36 upon actuation of handle 38 from the full line position shown in FIG. 2 whereby prism 34 may be located directly beneath chip 13 and directly above the desired one of chip sites 12 on substrate 10. The operator, while viewing through microscope 32, adjusts the X-Y position of table 20. As will be pointed out in more detail hereafter, probe 22 can be rotated so that the operator can adjust for any angular misalignment. In order to use the optical system, it should be obvious that the probe 22 is in a raised position such as shown in FIG. 2b and prism 34 is merely moved into the appropriate viewing position for alignment and, when alignment is complete, the prism is retracted so as to be out of the way of any interference with vertical movement of probe 22 and its support structure.

Referring now to FIG. 6, probe 22 is mounted in a cage 40 and comprises a selectively energizable infrared lamp 42, which is the source of the infrared energy used to melt the solder on chip 13. Lamp 42 is enclosed in a reflector assembly 44 which directs energy from lamp 42 to a focal plane which, during the melting operation, includes the region of the solder on chip 13, as more fully pointed out hereinafter. Lamp 42 and reflector 44 are commercially available and include a water cooling tube 54 connected to a suitable source of coolant water. The inner surfaces of reflector 44 are gold plated to increase the reflecting efficiency. The energy is directed downwardly by reflector 44 through a quartz plate 46 which overlies a conical chamber 47 the lower end of which is defined by a downwardly opening conical tip 50 having a circular opening through the lower end thereof, the edge of the tip surrounding the opening being flat and horizontal so as to hold a chip in a horizontal position. A port 52 communicates with chamber 47 and is selectively connectable to a vacuum source for creating a pressure differential for picking up and holding a chip 13 or to a source of slightly pressurized nitrogen gas which flows through chamber 47 to release a chip. During soldering, such flow is maintained to prevent the accumulation of vapor deposits on plate 46. Plate 46 would prevent any such vapors from entering into the reflector 44. Plate 46 rests upon a shield 48 having a plurality of chambers or grooves 49 therein through which coolant water flows. Shield 48 is opaque to radiant energy so that the only radiation emerging therefrom comes out the opening in tip 50.

Shield 48 includes a ring 56 having a peripheral groove which receives the tips of members 58 connected to cage 40. Members 58 and ring 56 allow the probe to be rotated about a vertical axis relative to cage 40 by grasping handles 60 at either side thereof. It thus allows a chip to be angularly aligned relative to a chip site.

Lamp 42 is energized by power from a source 62 which passes through a variac 64 and is further controlled by a timer 66 so that the lamp remains on for a period of time preset by timer 66. The variac 64 is connected to a volt meter 68. The total power thus delivered to lamp 42 is controlled by the length of time determined by timer 66 and by the voltage as determined by variac 64. The time and voltage are preset, as determined by trial and error, to provide a rapid heating cycle necessary to develop good metallurgical properties within the resultant bond.

Slide assembly 24 includes a vertically movable plate 70 mounted for sliding movement by a slide 71, 73 upon an upstanding portion 77 of base 30. As shown in FIG. 2b, the upper end of plate 70 is connected to a rearwardly extending member 72 which carries a micrometer 74 having an abutment plate 75 on the lower end thereof. Plate 75 is aligned with a dash pot 76 mounted on the upper edge of portion 77 and defines the lower limit of travel of plate 70. A second rearwardly extending member 78, similar to member 72, is connected to the lower end of plate 70 and has an adjustable stop 80 mounted thereon that abuts a dash pot 82, similar to 76, to define the upper limit of travel of plate 70. Plate 70 is thus movable vertically, that is in the Z direction, between raised and lowered limits defined by stops 80 and 75 in conjunction with dash pots 82 and 76. The rear ends of member 72 and 78 are connected to the piston rod 84 of a double action piston assembly 86, which may be pneumatic or hydraulic, that is selectively energizable or operable to cause the desired movement to take place. Operation of piston assembly 86 causes plate 70 to move from the position shown in FIG. 2b downwardly until dash pot 76 is contacted by abutment plate 75. The limits of travel are preset to provide a travel distance greater than the distance between probe 22 and substrate 10 so that when the plate 70 is moved downwardly, there will be a slight degree of over-travel thereof, in a manner pointed out below, once probe 22, either with a chip thereon or without one, moves downwardly and abuts substrate 10.

To accomplish the over-travel, cage 40 is mounted on a plate 88 which in turn is mounted on plate 70 by slide 90, 92. Block 90 is connected to the lower end of plate 70. Block 92 is connected to the rear lower end of plate 88. Plate 88 is also connected to two rearwardly extending pins 94 which in turn are connected to the end of two belts 96 that pass over two pullies 98 and have their other ends connected to tension springs 100. The lower end of springs 100 are connected to the lower ends of plate 70. The tension or tensile forces in springs 100 offset the weight of the parts mounted on plate 88 so that these parts "float" relative to plate 70. The tensile forces are preset so as to cause probe 22 to place a chip 13 on a module 10 with a substantially constant pressure which would vary only slightly with differences in thicknesses of different substrates. With this floating arrangement, as slider assembly 24 moves downwardly and chip 13 engages substrate 10, plate 70 can continue moving downwardly while probe 22 remains fixed and presses chip 13 against substrate 10 with a pressure determined by the forces of springs 100.

Figure 7:
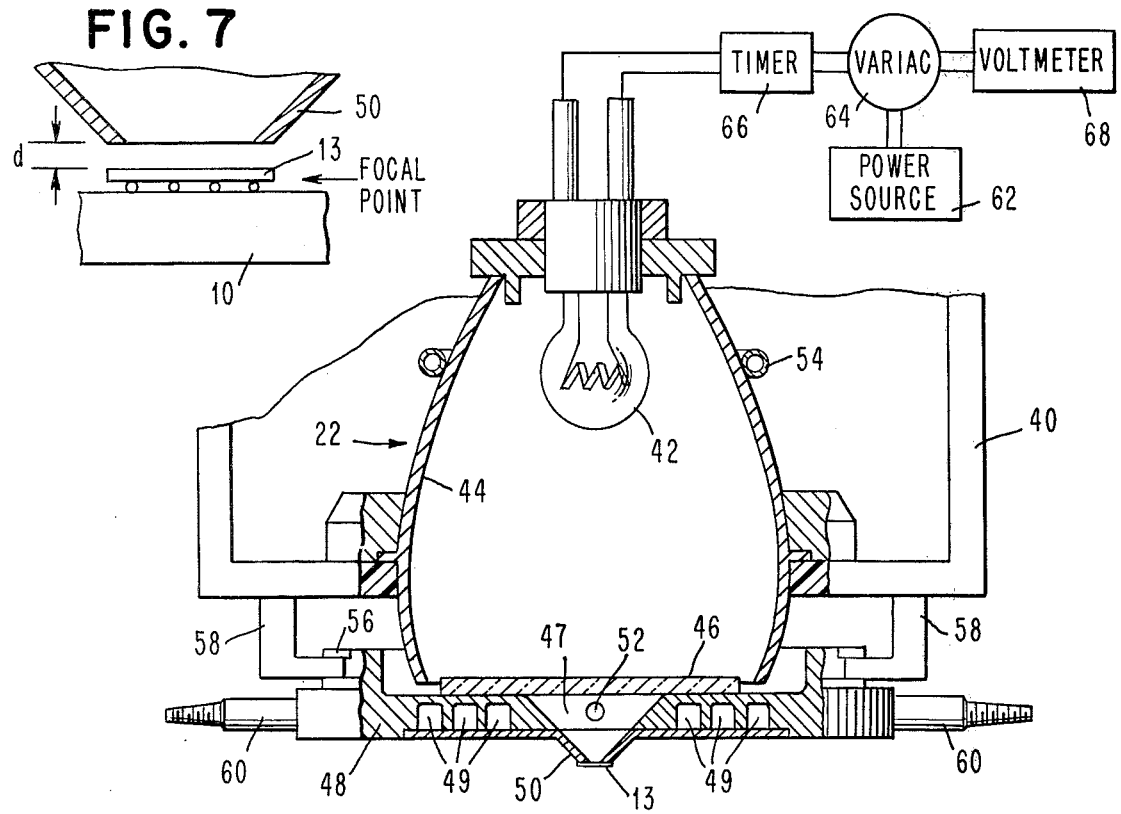
FIG. 7 is an enlarged detail view illustrating the back-off distance.

Once the chip has been placed on a substrate, it is desirable to back off probe 22 out of contact with the chip while the radiant energy is applied to heat the solder balls. Thus, with reference to FIG. 7, once chip 13 is placed on substrate 10, then probe 22 is raised a fixed distance d above chip 13. The location of lamp 42 relative to reflectors 44 is such that the focal plane of the energy is directed to the plane of the solder balls of the chip and this plane is beneath tip 50 of probe 22. The focal plane is in reality a very small region where the intensity of the infrared energy is uniform and is at its highest and might be in the order of 0.060 inches deep. It is within this region that the infrared energy is concentrated and so the solder joints or solder balls dependent upon whether the chip is being attached, or simply reflowed, or removed, is located. Because of the variations in thicknesses of different substrates and because of the possibility that within a given substrate the chip sites will be at different elevations, and because the temperature gradient within the focal region is very high, it is also desirable to maintain the backoff distance d constant regardless of the application. The manner in which this is done is described in the next paragraph.

As best seen in FIGS. 3–5, a piston assembly 102 is mounted on plate 70 and the piston rod 104 thereof extends upwardly towards the adjustable face of a micrometer 106 which is also mounted on plate 70. The distance d between the upper end of piston rod 104 and the lower end of 106 is the backoff distance. Mounted on the upper end of plate 88 is a fixed member 110 which is bifurcated to receive a pivoted detent arm 112. Piston rod 104 extends upwardly in the space between detent 112 and member 110 as shown in FIG. 5. A spring 114 biases detent arm 112 away from engagement with 104. In the normal operation of the slide assembly 24, wherein plate 88 floats on plate 70, detent 112 is disengaged from operative engagement with piston rod 104 whereby member 110 and detent 112 are free to slide up and down relative to piston rod 104. This action permits the degree of relative travel or over-travel of probe 22 when it contacts substrate 10. A cylinder and piston assembly 116 is mounted on the upper end of plate 88 and has a piston rod 118 that abuts detent 112. Upon actuation of piston assembly 116, piston rod 118 is forced outwardly, to the right as shown in FIG. 5, thereby pivoting detent 112 into operative engagement with piston rod 104 which is thereupon wedged between detent 112 and member 110 to frictionally interlock these parts so as to prevent sliding movement therebetween. The result is that plate 88 is thus locked with plate 70. Once interlocked, operation of piston assembly raises plate 88 and probe 22 the backoff distance d.

Referring now to FIG. 6, X-Y table 20 is open in the center and bias heater 28 extends downwardly within this opening beneath substrate 10. Bias heater 28 includes two horizontally spaced elongated IR lamps 120 located beneath substrate 10. Heater 28 includes a metallic enclosure 122 the inner portion of which is covered by insulation 124 to form a heat chamber 126 beneath the substrate. A surrogate substrate 128 is mounted on a flange 11 and is attached to the lower part of enclosure 122. Substrate 128 is mounted the same distance from lamps 120 as is substrate 10 so that they receive substantially the same amount of radiant energy therefrom. Substrate 128 is similar in shape and thermal characteristics to substrate 10. A thermocouple 130 is attached to the lower surface thereof away from lamp 120 at a point which effectively corresponds to the location of a chip site on substrate 10. Thus, when lamps 120 are energized, both substrates 128 and 10 heat at approximately the same rate. Thermocouple 130 is in turn connected to a controller 132 which controls a power source 134 that supplies the electrical energy for operating lamps 120. Controller 132 is set so that when power is turned on, lamps 120 are energized and heat substrate 10 to the bias temperature, this temperature being maintained to minimize any thermal shock to substrate 10 when lamp 42 is energized during a rework or placement operation. The set point of controller 132 is determined by mounting a substrate 10 in the holder and placing a calibrating thermocouple on a chip site thereof. The lamps 120 are energized and when the temperature of the calibrating thermocouple corresponds to the desired bias temperature, the temperature of thermocouple 130 is noted and controller 132 is set to maintain such temperature as the set point. The bias temperature can readily be selected by those skilled in the art dependent upon the particular solder being used. The length of time that timer 66 is on and the setting of variac 64 can also be done by one skilled in the art to produce an effective bond.

A tube 136 admits nitrogen at ambient temperature into chamber 126 at a flow rate sufficient to mix the gases therein and prevent the formation of thermal pockets or layers to thereby produce a more uniform temperature distribution across substrate 10. Manifolds 139 and 141 are selectively connectable to a source of cool nitrogen and communicate with a series of nozzles 142 and 144 which direct cooling jets against substrates 10 and 128. The flow of nitrogen through manifolds 139 and 141 is separately controlled so as to concurrently cool both substrates quickly to ambient temperature.

In the operation of the apparatus for chip placement purposes, a substrate 10 is first mounted on table 20 and a chip 13 is placed on the lower end of probe 22. A vacuum is applied to hold chip 13 in place. X-Y table 20 may be then moved by the operator so as to roughly bring the desired chip site beneath chip 13. Then, prism 34 is slid into position between the chip site and chip 13. The chip and chip site are aligned as described previously. The slide is then withdrawn. The chip site may then be fluxed. Once substrate 10 is in place, bias heater 28 may be then operated to raise the temperature of substrate 10 to the desired bias temperature. This may be done concurrently with the aligning operation. Once the bias temperature has been reached, then piston assembly 86 is actuated to lower slide assembly 24. As it moves down, chip 13 is placed in the desired position on the chip site with a pressure determined by the forces of springs 100. When probe 22 stops its downward movement, further movement of plate 70 continues until stop 76 is contacted by plate 75. At this point, the vacuum is released and chip 13 is then free to remain on substrate 10. The flow of nitrogen through tip 50 commences when the vacuum is released. Piston assembly 116 is then actuated to clamp or lock plate 88 to piston rod 104. Then, piston assembly 102 is actuated causing piston rod 104 to move upwardly the desired back-off distance. This upward movement causes plate 88 to move upwardly and thereby move probe 22 the desired back-off distance above chip 113. Lamp 42 is energized to melt the solder balls on chip 113 and lamp 42 is then shut off allowing the solder joint to solidify. Thereafter, piston assembly 86 can be actuated to raise assembly 24, and piston assemblies 102 and 116 deactuated to allow plate 88 to float relative to plate 70.

To rework a chip, it is placed beneath probe 22 and the probe is then lowered and backed off to locate the solder joint in the focal plane. Lamp 42 is operated to melt the joints and then allow the solder to solidify into new joints. To remove a chip, probe 22 is moved to the back-off position and lamp 42 is first turned on to melt the solder and later it is turned off. While the solder is molten, the chip is then picked up by connecting chamber 47 to a vacuum. This causes the chip to be lifted off the chip site and held against tip 50. Assembly 24 is then raised.

It should be obvious that many changes can be made in the details and arrangements of parts without departing from the scope of the invention as defined in the appended claims.

What is claimed is:

1. In soldering apparatus for multichip modules each having a substrate provided with a plurality of chip sites on one face thereof, and wherein the elevation of each chip site within a module may vary and the thickness of different substrates may vary, a combined chip handling and heating tool comprising:

a selectively energizable infrared radiant heat source,
a reflector surrounding said heat source and having a first opening therein,
a quartz plate covering said first opening,
and a shield covering said plate and having a second opening therein thru which said radiant energy passes, said reflector being operative to direct radiant energy through said plate and said first and second openings and concentrate such energy in a focal plane over an area of substantially the same size as a chip, said plane being external to said tool and located a fixed distance therefrom;
said shield being operative to limit said radiant energy to only the chip being worked on by said tool, said shield having a conical tip extending from said plate and terminating in an edge surrounding said second opening, said edge being adapted to engage a chip;
first means adapted to selectively connect said tool to a vacuum source for selectively holding a chip against said edge;
said tip and plate defining a chamber communicating with said first means whereby the lower pressure is said chamber due to connection to the vacuum source allows a chip to be held against said edge due to atmospheric pressure;
and second means for producing relative movement between said tool and a chip site to locate a chip thereon and to locate said tool so that solder on the chip is in said focal plane of said radiant energy.

2. The combination of claim 1 wherein said tool is operative to bond a chip to a chip site, said second means including means to first align the chip above the chip site, means to next lower the chip onto the chip site, and means to thereafter raise said tool to locate the solder on the chip in said focal plane,
said heat source being energized for a period to time to reflow solder on said chip and form a bond attaching the chip to the substrate at the chip site.

3. The combination of claim 1 wherein said tool is operative to reflow a preselected chip solder bonded to the substrate, said second means being operative to position said tool above the preselected chip with the solder joining the chip being in said focal plane, said heat source being energized for a period of time sufficient to first melt the solder bond and then to solidify the molten solder to form a new bond.

4. The combination of claim 1 wherein said tool is operative to remove a preselected chip solder bonded to the substrate, said second means being operative to position said edge above the preselected chip with the solder joining the chip being in said focal plane, said heat source being energized to melt the solder joining the chip, said second means including means to create an air pressure differential in said tool to lift the chip from the chip site while the solder is molten into engagement with said edge and to thereafter raise said tool with the chip held against said edge.

5. The combination of claim 1 wherein:
said reflector, said plate, said heat source and said shield are joined to form a probe;
and said second means comprises
an X-Y table adapted to hold the substrate and move it in a horizontal plane to locate a preselected chip site beneath said probe, and
third means mounting said probe for vertical movement relative to the preselected chip site between positions to locate the solder on the chip in said focal plane.

6. The combination of claim 5 wherein:
said second means further comprising fourth means mounting said probe for rotation about a vertical axis to allow angular alignment of a chip relative to a chip site.

7. The combination of claim 1 comprising:
a bias heating means operative to heat the substrate to an elevated bias temperature to prevent thermal shock of the substrate due to energization of said heat source.

8. The combination of claim 7 wherein said bias heating means comprises:
a surrogate substrate spaced from the first mentioned substrate, a second source of infrared radiant heat located to simultaneously heat said surrogate substrate and the first substrate, third means for detecting the temperature of a part of said surrogate substrate, and fourth means responsive to said third means for controlling energization of said second source so as to heat the first substrate to said bias temperature and maintain it at substantially such temperature.

9. The combination of claim 8 wherein:

said second means comprises means adapted to mount the first substrate with the chip sites facing away from said second source, said surrogate substrate having a shape and thermal characteristics substantially the same as those of the first substrate, said third means comprising a thermocouple attached to said surrogate substrate on a side thereof away from said second source and corresponding to the location of a chip site.

10. The combination of claim 8 wherein said bias heating means comprises:

a thermally insulated enclosure enclosing said second source, said enclosure having open portions receiving said surrogate substrate and the first substrate, and gas flow means selectively operable to mix gasses within said enclosure to prevent the build up of thermal pockets and layers during operation of said second source.

11. The combination of claim 10 comprising:

selectively operable cooling means operative to direct jets of a coolant fluid against both substrates to simultaneously cool them to ambient temperature.

12. In soldering apparatus joining a flat chip having solder balls on one face thereof to a preselected chip site of a substrate populated with other chips, said chip site including pads to be joined to the solder balls, the combination comprising:

a probe comprising
 a selectively energizable infrared source,
 reflector means operative to concentrate infrared energy from said source into a focal plane located beneath said probe,
 a shield substantially opaque to the passage of energy from said source having an opening therein through which radiant energy passes, said opening being of approximately the same size as that of the pattern of balls on the chip, said opening being above the focal plane, and first means to selectively connect said probe to a vacuum source allowing a chip to be supported by said probe in a position covering said opening;

second means adapted to support a substrate beneath said probe with a chip site thereon vertically aligned with the chip supported by said probe;

and third means operative to support said probe above said second means and move said probe vertically between an upper position spaced above said substrate, a lower position engaged with a chip on the chip site and a heating position located between said upper and lower positions, the solder on a chip on a chip site being in said focal plane when said probe is in said heating position, said third means comprising:

a first plate movable vertically between raised and lowered positions a distance greater than the distance between said upper and lower positions of said probe, fourth means for selectively moving said first plate between said raised and lowered positions, a second plate connected to said probe, fifth means floatingly mounting said second plate on said first plate for movement therewith as said first plate moves from said raised position towards said lowered position until said probe reaches said lower position and for relative movement as said probe remains in said lower position while said first slide moves into said lowered position, said fifth means being operative to allow movement of said probe from said lower position to said heating position while said first slide is in said lowered position, and sixth means for moving said second slide relative to said first slide to move said probe from said lower position to said heating position.

13. The combination of claim 12 wherein:

said fifth means comprises a selectively actuated detent means moveable between operative and inoperative positions, said detent means in said operative positions being operable to connect said second plate to said sixth means so as to be moved thereby.

14. The combination of claim 12 comprising:

adjustable stop means operatively connected to define said heating position of said probe.

* * * * *